United States Patent
Grover et al.

(10) Patent No.: US 9,519,813 B2
(45) Date of Patent: Dec. 13, 2016

(54) PROPER INSTALLATION DETERMINATION BASED ON RFID

(75) Inventors: Rajeev Grover, Rocklin, CA (US); David R Cowles, Granite Bay, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 173 days.

(21) Appl. No.: 14/366,786

(22) PCT Filed: Dec. 21, 2011

(86) PCT No.: PCT/US2011/066360
§ 371 (c)(1),
(2), (4) Date: Jun. 19, 2014

(87) PCT Pub. No.: WO2013/095414
PCT Pub. Date: Jun. 27, 2013

(65) Prior Publication Data
US 2014/0368311 A1    Dec. 18, 2014

(51) Int. Cl.
*G06K 7/10* (2006.01)
*G06K 19/077* (2006.01)
*G07C 3/00* (2006.01)
*H05K 7/14* (2006.01)

(52) U.S. Cl.
CPC ....... *G06K 7/10366* (2013.01); *G06K 7/10425* (2013.01); *G06K 19/07798* (2013.01); *G07C 3/00* (2013.01); *H05K 7/1489* (2013.01); *H05K 7/1498* (2013.01)

(58) Field of Classification Search
None
See application file for complete search history.

(56) References Cited

U.S. PATENT DOCUMENTS

| | | | |
|---|---|---|---|
| 7,071,825 B2 * | 7/2006 | VoBa | G08B 13/2462 340/13.26 |
| 7,489,246 B2 * | 2/2009 | Himberger | G06K 19/0723 235/440 |
| 7,561,786 B1 | 7/2009 | Black | |
| 7,607,014 B2 * | 10/2009 | Larson | G06F 21/35 713/154 |
| 7,775,083 B2 * | 8/2010 | Potyrailo | G01N 27/021 73/19.01 |

(Continued)

FOREIGN PATENT DOCUMENTS

| | | |
|---|---|---|
| CN | 2537180 Y | 2/2003 |
| CN | 1773526 A | 5/2006 |

(Continued)

OTHER PUBLICATIONS

Extended European Search Report, EP Application No. 11877730.9, Date: Jun. 25, 2015, pp. 1-6.

(Continued)

*Primary Examiner* — Brian Miller
(74) *Attorney, Agent, or Firm* — Hewlett Packard Enterprise Patent Department

(57) ABSTRACT

A radio frequency identification (RFID) transceiver may be associated with an identification proximity to identify an RFID tag associated with a component. A control may determine proper inflation of component based on the RFID tag being identified.

20 Claims, 4 Drawing Sheets

(56) References Cited

U.S. PATENT DOCUMENTS

| | | | | |
|---|---|---|---|---|
| 7,825,776 | B2* | 11/2010 | Smith | G06F 9/44505 340/10.51 |
| 7,857,214 | B2* | 12/2010 | Saliaris | G06F 1/181 235/383 |
| 7,978,060 | B2* | 7/2011 | Mandava | G06K 7/0008 340/10.1 |
| 8,332,179 | B2* | 12/2012 | Nolle | F15B 13/0839 702/104 |
| 8,651,379 | B2* | 2/2014 | Thielmann | H05K 7/1488 235/375 |
| 8,659,395 | B2* | 2/2014 | Kilian | G06K 7/0008 340/10.1 |
| 8,810,364 | B2* | 8/2014 | Komine | G05B 19/0428 340/10.1 |
| 8,880,907 | B2* | 11/2014 | Ives | H04L 12/10 713/300 |
| 8,914,495 | B2* | 12/2014 | Das | H05K 7/1498 709/224 |
| 9,000,895 | B2* | 4/2015 | Shih | H05K 7/20836 165/80.3 |
| 9,066,441 | B2* | 6/2015 | Kilian | |
| 9,165,172 | B2* | 10/2015 | Kilian | H05K 7/1489 |
| 9,341,703 | B2* | 5/2016 | Everth | G01S 5/16 |
| 2003/0220851 | A1 | 11/2003 | Ichikawa et al. | |
| 2006/0277275 | A1* | 12/2006 | Glaenzer | H04L 67/125 709/219 |
| 2007/0075832 | A1 | 4/2007 | Morse et al. | |
| 2008/0114865 | A1* | 5/2008 | Rothman | H04L 12/66 709/223 |
| 2008/0272887 | A1* | 11/2008 | Brey | H04L 12/24 340/10.1 |
| 2009/0036165 | A1 | 2/2009 | Brede | |
| 2009/0108995 | A1* | 4/2009 | Tucker | G06K 7/0008 340/10.1 |
| 2009/0189767 | A1* | 7/2009 | Primm | G06K 7/0008 340/572.1 |
| 2009/0195363 | A1 | 8/2009 | Downie et al. | |
| 2010/0328050 | A1* | 12/2010 | Kothari | G03G 15/5075 340/10.51 |
| 2011/0047263 | A1* | 2/2011 | Martins | G06F 1/183 709/224 |
| 2011/0187503 | A1* | 8/2011 | Costa | H05K 7/1498 340/8.1 |
| 2012/0161938 | A1* | 6/2012 | Kilian | H05K 7/1489 340/10.1 |
| 2013/0138364 | A1* | 5/2013 | Cowles | G06F 1/206 702/45 |
| 2013/0194585 | A1* | 8/2013 | Cowles | G06F 1/183 356/614 |

FOREIGN PATENT DOCUMENTS

| | | |
|---|---|---|
| CN | 1825334 A | 8/2006 |
| CN | 101149809 A | 3/2008 |
| JP | 2006268128 | 10/2006 |
| JP | 2008104033 | 5/2008 |
| KR | 20070043186 | 4/2007 |
| WO | WO-2008030659 | 3/2008 |

OTHER PUBLICATIONS

International Search Report and Written Opinion, International Application No. PCTIUS2011/066360, Date: Sep. 17, 2012, pp. 1-7.
Office Action, TW Application No. 101149072, Date: Mar. 11, 2015, pp. 1-8.
Office Action, CN Application No. 201180076424.0, Date: Jul. 22, 2016, pp. 1-14, SIPO.

* cited by examiner

PROPER INSTALLATION DETERMINATION BASED ON RFID

BACKGROUND

A computing device may be associated with various components to be installed. A component may enable the computing device to operate, and may be optional. The computing device may be impaired if operated improperly, including operating the computing device with or without a component, or with an improperly installed component.

BRIEF DESCRIPTION OF THE DRAWINGS/FIGURES

DETAILED DESCRIPTION

A computing device and/or computing system may be associated with a component that may be installed at the computing system. The competing system may operate differently based on what component(s) is/are installed, and a component may be capable of improper installation. For example, a fan component may be associated with airflow in a specific direction, but may be capable of being installed backwards or otherwise inconsistent with the specified airflow direction. A computing system may provide cooling based on heat-generating component(s) (e.g., a processor, a storage device, and the like) for a desired level of performance/operation of the heat generating component and the computing system. A computing system may provide proper cooing by adjusting operational parameters (e.g., increasing fan speed and/or ventilation) to compensate for increased heat generation, and/or to compensate for additional back-pressure of an installed air filter and/or opacity shield. Similarly, a computing system may adjust fen speed to compensate for a disturbed airflow path (e.g., missing system panel or open computer case) to ensure proper operation without overheating.

In an example, the computing system may identify an RFID tag associated with a component installable at the computing device, using an RFID transceiver associated with an identification proximity. A controller associated with the computing system may determine proper installation of the component based on the RFID tag being identified.

Figure 1:
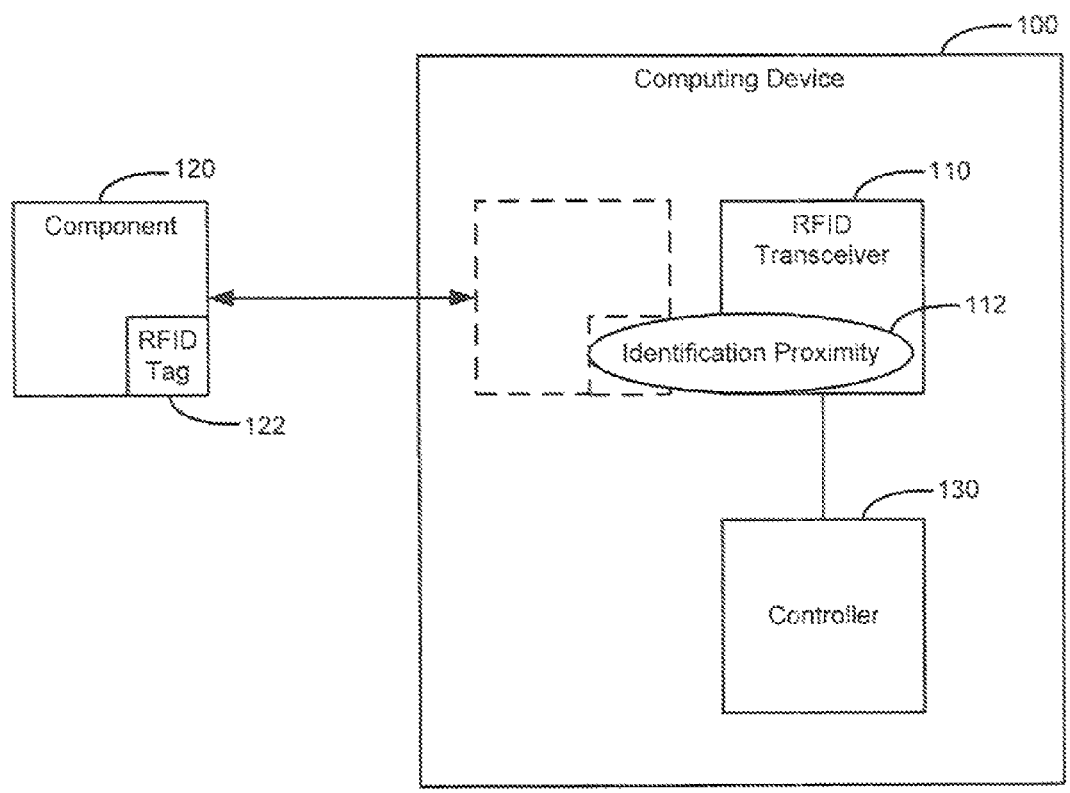
FIG. 1 is a block diagram of a computing device inducting an RFID transceiver according to an example.

FIG. 1 is a block diagram of a computing device 100 including an RFID transceiver 110 according to an example. The RFID transceiver 110 may be associated with an identification proximity 112. The computing device 100 may include a controller 130 associated with the RFID transceiver 110.

The computing device 100 may be a personal computer, a server, a network switch, and/or other devices/systems associated with a controller 130. Computing device 100 may be a stand-alone module (e.g., microcontroller) that may interface with a network switch or other device. The controller 130 may be a processor such as a Central Processing Unit (CPU), and may be a processing module including at least one processor. In an example, controller 130 may be a CPU of a network switch.

RFID transceiver 110 may transmit and receive electromagnetic signals for RFID. In an example, RFID transceiver 110 may comply with standards, such as ISO/EC 18000-7: 2009 Information technology. Radio frequency identification for item management, Part 7: Parameters for active air interface communications at 433 MHz. The RFID transceiver 110 may be associated with forward and return link parameters for information including, but not limited to, operating frequency, operating channel accuracy, occupied channel bandwidth, maximum power, spurious emissions, modulation, duty cycle, data coding, bit rate, bit rate accuracy, bit transmission order, and, where appropriate, operating channels, frequency hop rate, hop sequence, spreading sequence, and chip rate.

RFID transceiver 110 may comply with other standards for radio frequency communications, including Parts 1-6 of ISO/IEC 18000, and various frequency ranges for RFID or other forms of electromagnetic communications and protocols. The RFID transceiver 110 may provide identification based on identification proximity 112.

The identification proximity 112 may enable the RFID transceiver 110 to identity an RFID tag 122 of a component 120. The identification proximity 112 is illustrated as an oval, but may take other forms. For example, the identification proximity 112 may be larger or smaller, and may assume various shapes, based on a transmission power, shielding or other effects of computing device 100 (e.g., its chassis), and/or a radiation pattern of the RFID transceiver 110. In an example, the transmission power may be on the order of 500 milliwatts (mW) at 433 MHz. The identification proximity 112 may be confined within the computing device 100. Thus, during assembly on an assembly line for example, the identification proximity 112 of a first computing device 100 may be prevented from detecting an RFID tag 122 of a component to be installed in and/or already installed in a second computing device on the assembly line near the first computing device 100.

The RFID tag 122 may be added to the component 120, e.g., added as an adhesive sticker or insert attached to the component 120. The RFID tag 122 may be integrated into the component 120, e.g., contained within molded plastic or otherwise incorporated into the component 120. A component 120 may include a hidden RFID tag 122 such that the component 120 as visually indistinguishable from a component that does not include an RFID tag 122.

The RFID tag 122 may be based on active, semi-active, battery assisted passive (BAP), and passive RFID tags. An active RFID tag 122 may have an on-board battery to broadcast or beacon a wireless signal. A battery assisted passive RFID tag 122 may have a small battery on board that is activated in the presence of a RFID reader. The RFID tag 122 may store data (e.g., 2 kilobytes), and may be composed of a microchip, antenna, and, in the case of active and semi-passive tags, a battery. The RFID tag 122 may include identification information stored at a data storage of the RFID tag 122. The RFID tag 122 may be enclosed within paper, plastic, silicon, and/or glass. The RFID tag 122 may include a microchip to be read based on the tag's antenna receiving electromagnetic energy from an antenna of the RFID transceiver 110. The RFID tag 122 may use power from its internal battery (active tag), or may use power harvested from an electromagnetic field propagated by the RFID transceiver 110. The RFID tag 122 may send a response to the RFID transceiver 110, which may detect radio waves associated with the response and interpret the response as meaningful data.

The RFID tag 122 may broadcast over a portion of the electromagnetic spectrum based on a frequency. The chosen frequency may be variable and may be chosen to avoid interference with other electronics or RFID tags/transceivers (e.g., tag interference or reader interference). The RFID transceiver may use a cellular system such as a Time Division Multiple Access (TDMA) protocol for wireless communication.

The RFID tag 122 and/or identificaton proximity 112 may be associated with different frequencies. An identification proximity 112 may be affected by frequency used, and may be affected by interference and/or penetration through various materials (e.g., penetration through materials of a computing device 100). In an example, a controller 130 may determine the presence of RFID interference at a given frequency, switch to a different frequency, and adjust a power and/or radiation pattern to maintain a desired identification proximity 112. The RFID tag 122 and/or identification proximity 112 may be associated with Low-frequency (125-134.2 kHz and 140-148.5 kHz; LF or LowFID), high-frequency (13.56 MHz; HF or HighFID), and Ultra-high-frequency (868-928 MHz; UHF, Ultra-HighFID, or UHFID). The RFID tag 122 and/or identification proximity 112 may be associated with restrictions on transmission power, radiation pattern, frequency, and/or other characteristics.

The computing device 100 may include a component interface to receive the component 120. Component 120 may include powered and/or passive components, including components that affect the computing device 100, such as affecting heat generation and/or heat dissipation of the computing device 100. Example components 120 may include a filter, an opacity shield (e.g., a louver and/or other component to affect light passage), a chassis/housing or other system panel, a fan, a processor, a storage device such as a hard disk or solid state drive (SSD), or other component. Component 120 may be optional, such that computing device 100 may be operated normally without installation of component 120, and may be operated with installation of component 120. Multiple components 120 may be used in combination, e.g., combining a filter component and an opacity shield component, such that individual and/or cumulative effects associated with each component may affect the computing device 100.

The component 120 may interact with the computing device 100 such that when the component 120 is properly installed, the RFID tag 122 of the component 120 falls within the identification proximity 112 of the computing device 100. Proper installation of the component 120 may relate to a position and orientation of the component 120, and may be based on physical dimensions of the component 120, physical dimensions of the component interface, a position and/or orientation of the RFID tag 122, the identification proximity 112, and other factors. For example, the identification proximity 112 may extend across a portion of the component interface, and the component 120 may physically fit within the component interface in a specific position/orientation, such that the RFID tag cannot enter the identification proximity 112 unless the component 120 is properly installed. In an example, the component 120 is asymmetrically shaped corresponding to the component interface, and the identification proximity 112 does not extend beyond a chassis of the computing device 100. Accordingly, such factors and others may enable proper installation of the component 120 to be detected by the controller 130, based on identification of the RFID tag 122.

Controller 130 may receive information associated with identifying the RFID tag 122, determine whether component 120 is installed property, and/or adjust operational parameters of the competing device 100. For example, controller 130 may adjust operation of a fan in response to determining proper installation of a filter component 120. The controller 130 may determine proper installation of a fan component 120, and adjust operation of that fan component 120. The controller 130 may interact with other components of computing device 100 not specifically shown, including controlling a first component based on determining proper installation of a second component.

In an example, computing device 100 may be operated with or without component 120 (an air filter), depending on factors associated with the computing device 100 such as an installation environment. Controller 130 may determine that the air filter component 120 is not installed, and operate a cooling fan component (not shown in FIG. 1) according to a first set of operational parameters such as a lower RPM. Controller 130 may determine that the air filter component 120 is properly installed, and operate the cooling fan component according to a second set of operational parameters such as a higher fan RPM. Thus, the controller 130 may compensate for proper installation of the component 120 (e.g., an air filter, opacity shield, or other component), enabling proper operational performance of computing device 100 regardless of whether component 120 is installed or removed.

The controller 130 may operate the computing device 100 at a first level of security based on a component (e.g., an opacity shield) not being installed properly, and may operate the computing device 100 at a second level of security based on the component being installed properly. In an example, the computing device 100 may limit access to guest privileges when the component is not installed, and may elevate access to administrator privileges when the component is installed.

Figure 2:
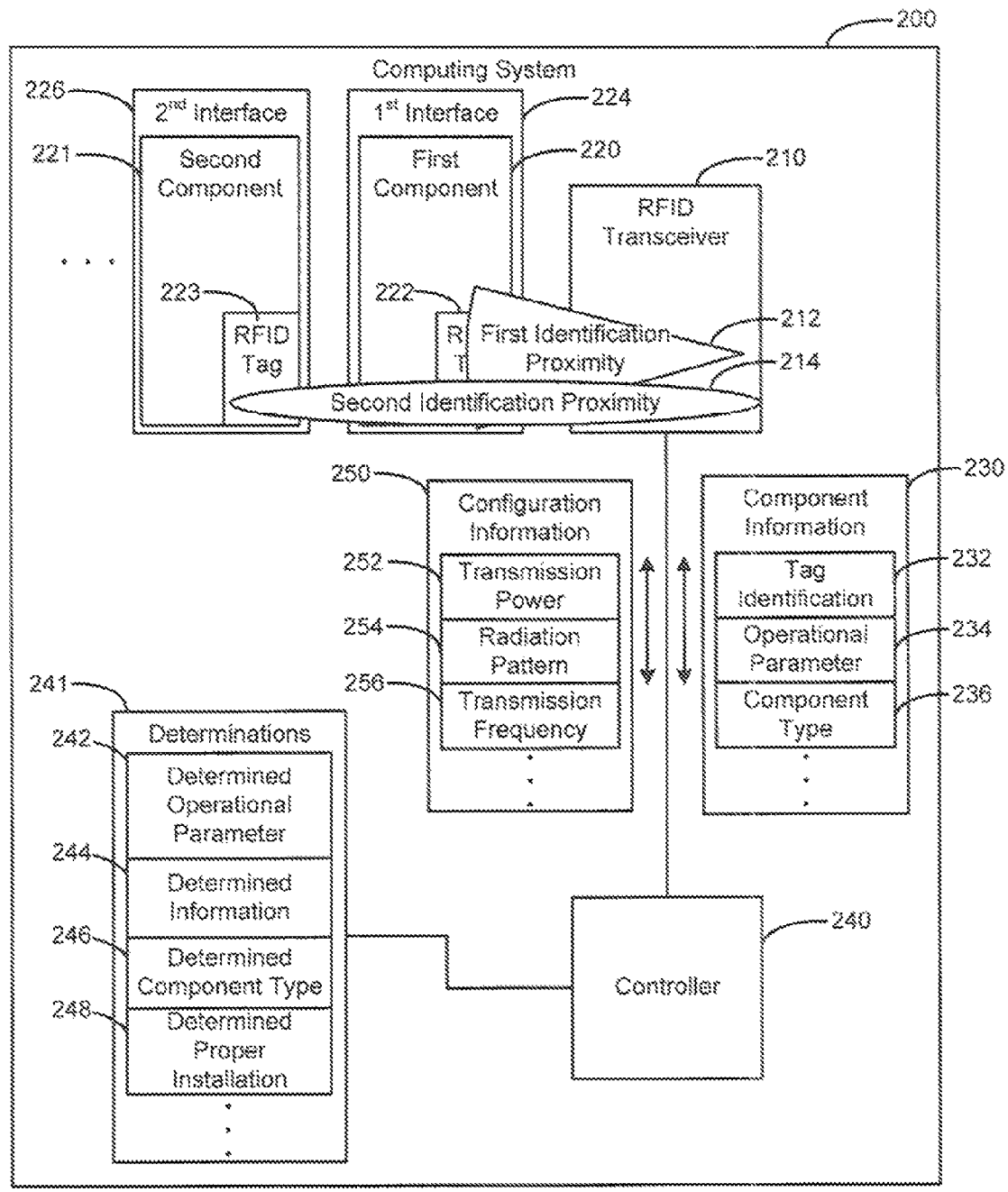
FIG. 2 is a block diagram of a computing system including an RFID transceiver according to an example.

FIG. 2 is a block diagram of a computing system 200 including an RFID transceiver 210 according to an example. The computing system 200 also may be associated with a first component 220, a first component interface 224, a second component 221, a second component interface 226, and a controller 240. The first component 220 may include a first RFID tag 222, and the second component 221 may include a second RFID tag 223. The RFID transceiver 210 may be associated with a first identification proximity 212 and a second identification proximity 214. Although the example of FIG. 2 shows first and second components, component interfaces, and identification proximities, additional components, component interfaces, and identification proximities may be included.

The controller 240 may send/receive configuration information 250 to/from the RFID transceiver 210, and may send/receive component information 230 to/from the RFID transceiver 210. The configuration information 250 may include transmission power 252, radiation pattern 254, transmission frequency 256, and other information to configure the RFID transceiver 210. In an example, the configuration information 250 may include initialization information for initializing the RFID transceiver 210 when installed in a computing system 200, such that the RFID transceiver 210 is initialized for operation in a particular computing system 200. The RFID transceiver 210 may be installable and customizable for various different computing systems 200, including systems having different chassis sizes, possible installable components, and possible positions and/or orientations of components. Accordingly, an example may include an RFID module installable in a variety of different computing systems that may be electronically programmed/updated based on the particular installation application. An example may also include a module installable in a system, wherein the module may be trained/taught how to recognize a properly installed component, e.g., a component may be properly installed and the module may receive instructions to associate corresponding RFID transceiver sense information with proper installation (and that sense information may be shared with other modules, by downloading, copying, and the like).

The component information 230 may include tag identification 232, operational parameter 234, component type 236, and other information. The component information 230 may be associated with a component. In an example, the component information 230 may be obtained based on a lookup at the controller 240 using identification information from the RFID transceiver 210. The component information 230 may be obtained from an RFID tag, and may be obtained without a need for a lookup. For example, the RFID tag may include data storage to store information to be obtained by the RFID transceiver 210 and passed to the controller 240 as component information 230.

In an example, a computing system 200 may determine proper installation of a first component 220 and a second component 221. First component 220 may be a fan including first RFID tag 222 storing data indicating voltage, current, duty cycle, rated airflow, and other performance characteristics associated with the fan and usable by controller 240 to operate the fan. A second component 221 may be a filter including second RFID tap 223 storing data indicating effects the filter may have on airflow, including offsets for increasing voltage, current, duty cycle, or other performance characteristics of the fan to enable acceptable operation of the computing system 200, e.g., to offset back-pressure introduced by proper installation of the filter. Thus, the example computing system 200 may identify proper installation of a component, may identify information regarding how to operate a property installed component, and may identify how to adjust operation of the computing system (including operation of a properly installed first component) when a second component is properly installed.

In an example, the first component 220 may be an air filter having a first capacity of air filtration and/or opacity (e.g., ability to block light passage). The second component 221 may be an air filter having a greater capacity of air filtration and/or opacity. Components may include system panels or other features that may affect the computing system 200, such as by affecting airflow and/or operation of other components. Accordingly, controller 240 may compensate for cumulative effects of various properly installed components.

Controller 240 may determine proper installation of a component. Controller 240 may provide additional determinations 241, such as a determined operational parameter 242, determined information 244, determined component type 246, determined proper installation 248, and other determinations 241 regarding a component and/or the computing system 200. For example, controller 240 may determine that a component is properly installed (determined proper installation 248) and provide determined information 244 (e.g., an indication such as lights, text, sounds, or other feedback that may communicate installation status information). In another example, controller 240 may determine whether a component is original equipment manufacture (OEM), aftermarket/replacement, genuine or counterfeit. The controller may make additional determinations such as a determined operational fault to indicate that detected component(s) do not correspond to an acceptable scenario/configuration of the computing system 200. For example, the controller 240 may determine that a first component 220 and a second component 221 are individually installed properly. However, the controller 240 may determine that the first component 220 and the second component 221 are incompatible with each other end should not be installed simultaneously on the competing system. For example, the first component 220 may be a fan to provide airflow sufficient for the computing system 200, but the second component 221 may be a highly restrictive filter that causes the overall airflow to be insufficient for cooling the computing system 200.

Component information 230 and configuration information 250 may be associated with information corresponding to various aspects of the computing system 200, including first component 220, second component 221, and other aspects of computing system 200. Controller 240 may, therefore, provide determined operational parameter 242 and/or adjustments specifically suited to a particular component or other aspect of computing system 200. Similarly, controller 240 may be associated with information for a particular computing system 200, e.g., based on attributes such as a flow-pressure curve associated with airflow through a specific computing system 200 and its various configurations (e.g., when all system panel components are installed). Such information may be preprogrammed, updated, learned/trained by operation of computing system 200, and otherwise associated with controller 240.

Controller 240 may provide determinations based on an identified tag (e.g. a tag number) and information available to the controller 240 (e.g., a lookup table of information for the controller to cross-reference the tag number to obtain information relevant to the identified tag/component). In an example, the controller may receive a numerical tag identification 232 of 12345678. The controller may then lookup the tag identification 232 and determine that number 12345678 corresponds to a fan having specific flow-pressure curve(s) and specific flow-current curve(s), e.g., curves associated with various duty cycles and/or voltages. The controller 240 may lookup a list of acceptable RFID tap identifications, and determine whether a component is acceptable based on whether its associated RFID tag identification is among the list.

The controller 240 also may provide determinations based on directly receiving information from a tag. In an example, the controller may receive component information 230 such as a component type 236 indicating that the component is a type of fan, and the component information 230 may indicate various specific flow-pressure curve(s) and specific flow-current curve(s), e.g., curves associated with various duty cycles and/or voltages. Various information may be stored at data storage of an RFID tag associated with a component, including information that may be used for other purposes (e.g., manufacturing information such as data of manufacture, lot number, and so on, or other information) not specific to operational performance of the computing system. Thus, the controller 240 may be compatible with components not previously known to the controller 240, and the controller 240 may configure/adjust the computing system 200 based on component information 230 not previously known to the controller 240 and obtained from an RFID tag.

In an example, the computing system 200 may use a long-range identification proximity to detect potentially installed component(s), and receive information from detected RFID tags of those components for instructing the controller to determine whether the detected components are properly installed. More specifically, the controller 240 may provide configuration information 250 to the RFID transceiver 210 to cause the RFID transceiver 210 to provide a search identification proximity (e.g., a large transmission power and/or wide radiation pattern) to search for possible components/RFID tags. Upon detecting an RFID tag, the RFID transceiver 210 may obtain component information 230 including information for configuring the identification proximity to allow the controller 240 to determine proper installation of that component (e.g., a low transmission power and/or narrow radiation pattern in conjunction with an orientation of the tag, component, and/or component interface). The controller 240 may determine proper installation of a component based on one RFID transceiver 210 (e.g., based on a single antenna associated with the RFID transceiver 210) and one RFID tag, without needing to use multiple RFID transceivers, antennas, and/or tags to determine position, orientation, and/or other factors associated with proper installation.

Figure 3:
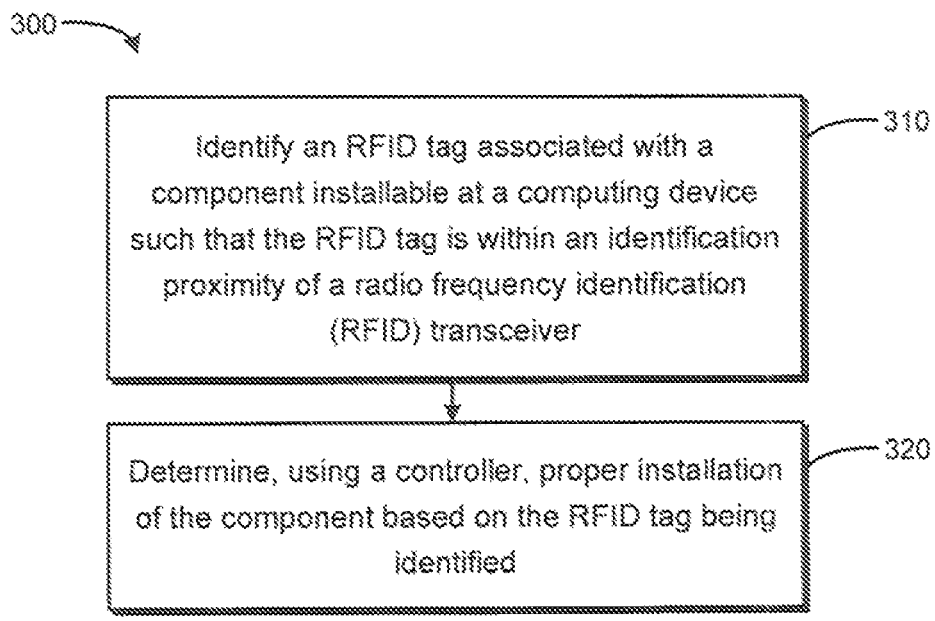
FIG. 3 is a flow chart based on determining proper installation of a component according to an example.

FIG. 3 is a flow chart 300 based on determining proper installation of a component according to an example. In block 310, an RFID tag is identified, the RFID tag associated with a component installable at a computing device such that the RFID tag is within an identification proximity of a radio frequency identification (RFID) transceiver. In an example, the RFID transceiver is to adjust an identification proximity based on transmission power, radiation pattern, transmission frequency, electromagnetic/RFID shielding, and/or other factors to affect the identification proximity. In another example, the component is installable at the computing device based on a component interface that is to physically interact with the component and provide an orientation and position for the component to assume when installed. For example, the component interface may be asymmetric to enable the component to be installed one way, preventing an RFID tag of the component from entering the identification proximity unless the component has a proper orientation and position associated with proper installation. In block 320, proper installation of the component is determined, using a controller, based on the RFID tag being identified. In an example, an operational parameter associated with the computing system may be adjusted based on determining proper installation. For example, the computing system may adjust an RPM of a fan, or adjust a voltage and/or frequency of a processor, based on proper installation of a filter associated with back-pressure that may affect airflow through the computing system. In another example, identifying the RFID tag may be associated with obtaining data from the RFID tag, such as an indication of an operational parameter associated with operating the computing system (e.g., the RFID tag may include an operational parameter for operating and/or adjusting the competing system and/or the component).

Figure 4:
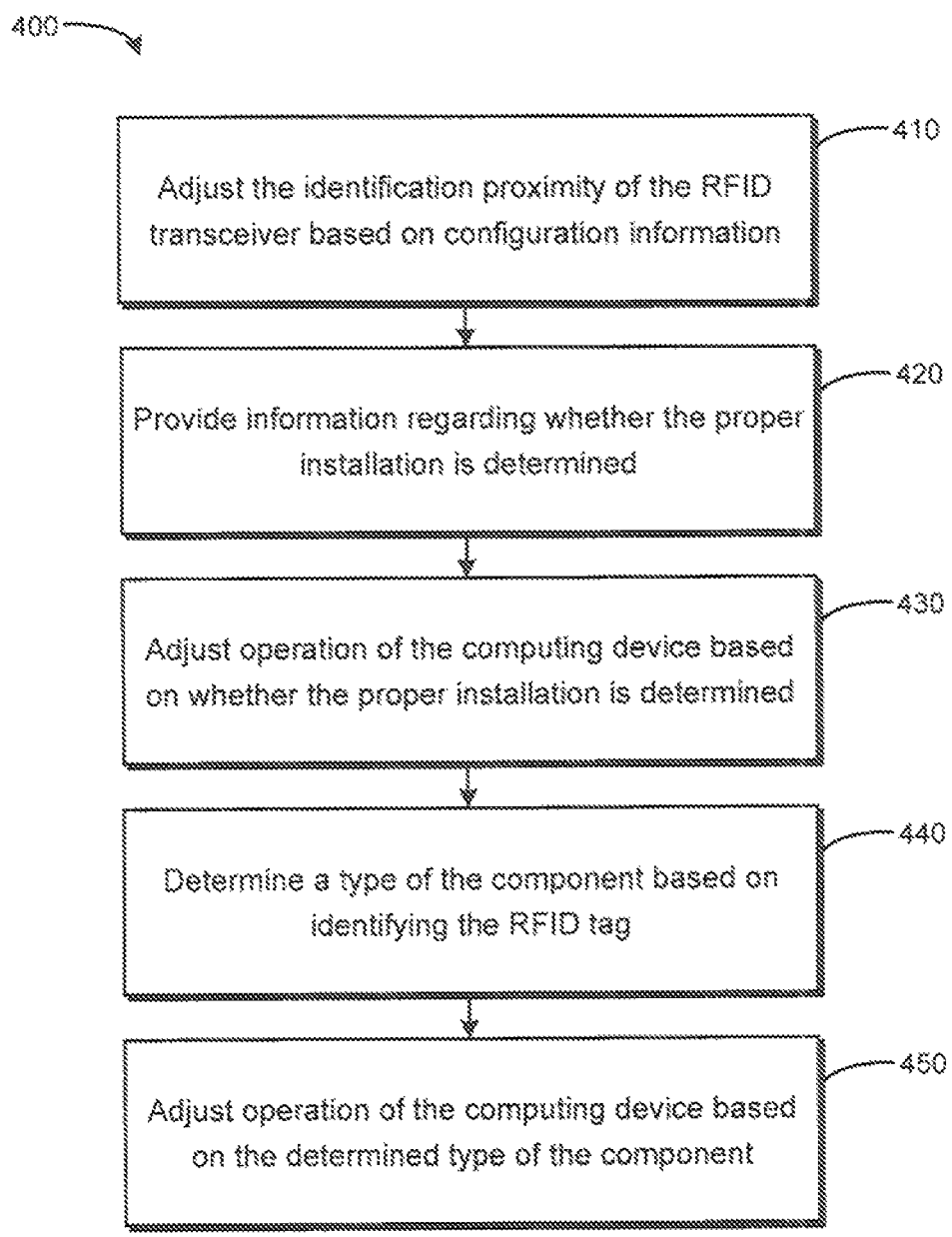
FIG. 4 is a flow chart based on adjusting a computing device according to an example.

FIG. 4 is a flow chart 400 based on adjusting a computing device according to an example. In block 410, the identification proximity of the RFID transceiver is adjusted based on configuration information. In an example, a controller may provide configuration information to the RFID transceiver, and the configuration information may include information to initialize the RFID transceiver for use with a particular computing system and/or identification proximity. In block 420, information is provided regarding whether the proper installation is determined. For example, a controller may provide status information such as an LED, text indication, or signal to indicate and/or communicate whether proper installation is determined. In block 430, operation of the computing device is adjusted based on whether the proper installation is determined. For example, the controller may adjust operation of a fan or processor of the computing system when the controller determines that a filter is properly installed (e.g., installed properly such that the filter affects back-pressure of airflow through and/or cooling of the computing system). In block 440, a type of the component is determined based on identifying the RFID tag. For example, the controller may use a lookup table to cross-reference a tag identification number with a type of component, or the controller may identify the RFID tag and obtain from the RFID tag information describing a type of the component, such as a low/flow, medium-flow, or high-flow air filter. In block 450, operation of the computing device is adjusted based on the determined type of the component. In an example, the controller may determine that the component is a low-flow filter type, and increase fan RPM to a high-speed to compensate for the low-flow filter in order to operate the computing system and maintain a desired level of cooling. The computing system may adjust other aspects, such as throttling a processor, adjusting operation of components such as storage, networking, wireless, and other devices based on determining proper installation of a component.

What is claimed is:

1. A computing device comprising:
   a radio frequency identification (RFID) transceiver associated with an identification proximity, wherein the identification proximity is to enable the RFID transceiver to identify an RFID tag associated with a component installable at the computing device, wherein being identified is based on whether the RFID tag has been detected due to passing within the identification proximity, and the RFID tag is deemed as not being identified if not detected due to the RFID tag not passing within the identification proximity; and
   a controller to determine proper installation of the component based on the RFID tag being identified, such that detection is interpreted as proper installation regardless of type of information provided by the RFID tag and regardless of where the RFID tag is located within the identification proximity.

2. The computing device of claim 1, wherein the controller is to determine the proper installation based on a transmission power of the RFID transceiver and a position and an orientation of the component such that the RFID tag is to be within the identification proximity and the component is to be installed at a component interface of the computing device.

3. The computing device of claim 1, wherein the controller is to adjust an operational parameter associated with the computing device in response to the proper installation being determined.

4. The computing device of claim 1, wherein the controller is to provide information regarding whether the proper installation is determined.

5. The computing device of claim 1, wherein the identification proximity is associated with a transmission power to identify the component when properly installed.

6. The computing device of claim 1, wherein the identification proximity is associated with a radiation pattern to identify the component when properly installed.

7. The computing device of claim 1, wherein the controller is to determine a type of the component based on the RFID tag being identified.

8. A computing system comprising:
a radio frequency identification (RFID) transceiver associated with an identification proximity;
a component installable at the computing system and associated with an RFID tag to be identified by the RFID transceiver based on the identification proximity and whether the RFID tag has been detected due to passing within the identification proximity, wherein the RFID tag is deemed as not being identified if not detected due to the RFID tag not passing within the identification proximity; and
a controller to determine proper installation of the component based on the RFID tag being identified, such that detection is interpreted as proper installation regardless of type of information provided by the RFID tag and regardless of where the RFID tag is located within the identification proximity.

9. The computing system of claim 8, further comprising a component interface to enable the RFID tag to enter the identification proximity if the component is properly installed, and to prevent the RFID tag from entering the identification proximity if the component is not properly installed.

10. The computing system of claim 8, wherein the RFID tag is to include an indication of a type of the component associated with the RFID tag.

11. The computing system of claim 8, wherein the RFID tag is to include an indication of an operational parameter associated with operating the computing system based on the proper installation of the component.

12. A method, comprising:
identifying an RFID tag associated with a component installable at a computing device such that the RFID tag is detected as passing within an identification proximity of a radio frequency identification (RFID) transceiver, wherein the RFID tag is deemed as not being identified if not detected due to the RFID tag not passing within the identification proximity;
determining, using a controller, proper installation of the component based on the RFID tag being identified, such that detection is interpreted as proper installation regardless of type of information provided by the RFID tag and regardless of where the RFID tag is located within the identification proximity.

13. The method of claim 12, further comprising adjusting operation of the computing device based on whether the proper installation is determined.

14. The method of claim 12, further comprising:
determining a type of the component based on identifying the RFID tag; and
adjusting operation of the computing device based on the determined type of the component.

15. The method of claim 12, further comprising adjusting the identification proximity of the RFID transceiver based on configuration information from the controller.

16. The computing device of claim 3, wherein the controller is to adjust a component operational parameter in response to the proper installation of that component being determined.

17. The computing device of claim 3, wherein the controller is to adjust a first component operational parameter associated with the computing device in response to the proper installation of a second component being determined.

18. The computing device of claim 17, wherein the first component is a fan, and the second component is an air filter.

19. The computing device of claim 3, wherein the controller is to adjust a level of security associated with the computing device in response to the proper installation of an opacity shield component being determined.

20. The computing device of claim 1, further comprising a component interface to enable the controller to identify at least one of i) a position, and ii) an orientation of the component, based on the component interface interacting with the component to prevent the component from being identified unless the component has been positioned at the proper orientation, even for situations where the component can be installed in the computing device at multiple different orientations.

* * * * *